US009257547B2

(12) United States Patent
Fichtenbaum et al.

(10) Patent No.: US 9,257,547 B2
(45) Date of Patent: Feb. 9, 2016

(54) III-N DEVICE STRUCTURES HAVING A NON-INSULATING SUBSTRATE

(75) Inventors: Nicholas Fichtenbaum, Santa Barbara, CA (US); Lee McCarthy, Santa Barbara, CA (US); Yifeng Wu, Goleta, CA (US)

(73) Assignee: Transphorm Inc., Goleta, CA (US)

( * ) Notice: Subject to any disclaimer, the term of this patent is extended or adjusted under 35 U.S.C. 154(b) by 1131 days.

(21) Appl. No.: 13/231,308

(22) Filed: Sep. 13, 2011

(65) Prior Publication Data

US 2013/0062621 A1 Mar. 14, 2013

(51) Int. Cl.

| | |
|---|---|
| ***H01L 21/335*** | (2006.01) |
| ***H01L 29/20*** | (2006.01) |
| ***H01L 29/778*** | (2006.01) |
| ***H01L 29/66*** | (2006.01) |

(52) U.S. Cl.

CPC ...... *H01L 29/7787* (2013.01); *H01L 29/66462* (2013.01); *H01L 29/2003* (2013.01); *H01L 2224/48091* (2013.01)

(58) Field of Classification Search

CPC ........................ H01L 21/8258; H01L 29/7783

USPC ............. 257/46, 47, 77, 84, 93–95, 102, 104, 257/188, 189, 285, 603–604, 606, E21.086, 257/E21.097–E21.1, E21.108–E21.113, 257/E21.117–E21.118, E21.542, E21.543, 257/E21.697

See application file for complete search history.

(56) References Cited

U.S. PATENT DOCUMENTS

| | | | |
|---|---|---|---|
| 4,300,091 | A | 11/1981 | Schade, Jr. |
| 4,645,562 | A | 2/1987 | Liao et al. |
| 4,728,826 | A | 3/1988 | Einzinger et al. |
| 4,821,093 | A | 4/1989 | Iafrate et al. |
| 4,914,489 | A | 4/1990 | Awano |
| 5,051,618 | A | 9/1991 | Lou |
| 5,329,147 | A | 7/1994 | Vo et al. |
| 5,618,384 | A | 4/1997 | Chan et al. |
| 5,646,069 | A | 7/1997 | Jelloian et al. |
| 5,663,091 | A | 9/1997 | Yen et al. |
| 5,705,847 | A | 1/1998 | Kashiwa et al. |
| 5,714,393 | A | 2/1998 | Wild et al. |
| 5,909,103 | A | 6/1999 | Williams |
| 5,998,810 | A | 12/1999 | Hatano et al. |
| 6,008,684 | A | 12/1999 | Ker et al. |
| 6,097,046 | A | 8/2000 | Plumton |

(Continued)

FOREIGN PATENT DOCUMENTS

| | | |
|---|---|---|
| CN | 1748320 A | 3/2006 |
| CN | 101107713 | 1/2008 |
| CN | 10132207 | 11/2008 |
| CN | 101897029 A | 11/2010 |
| CN | 102017160 A | 4/2011 |

(Continued)

OTHER PUBLICATIONS

Mishra et al., “Polarization-induced barriers for n-face nitride-based electronics,” U.S. Appl. No. 60/940,052, filed May 24, 2007, 29 pages.

(Continued)

*Primary Examiner* — Mamadou Diallo
(74) *Attorney, Agent, or Firm* — Fish & Richardson P.C.

(57) ABSTRACT

Embodiments of the present disclosure includes a III-N device having a substrate layer, a first III-N material layer on one side of the substrate layer, a second III-N material layer on the first III-N material layer, and a barrier layer disposed on another side of the substrate layer, the barrier layer being less electrically conductive than the substrate layer.

30 Claims, 12 Drawing Sheets

14
16
15
12
19
11
8
9
20
50
43

(56) References Cited

U.S. PATENT DOCUMENTS 6,100,571 A 8/2000 Mizuta et al.
6,292,500 B1 9/2001 Kouchi et al.
6,316,793 B1 11/2001 Sheppard et al.
6,373,082 B1 4/2002 Ohno et al.
6,475,889 B1 11/2002 Ring
6,486,502 B1 11/2002 Sheppard et al.
6,504,235 B2 1/2003 Schmitz et al.
6,515,303 B2 2/2003 Ring
6,548,333 B2 4/2003 Smith
6,583,454 B2 6/2003 Sheppard et al.
6,586,781 B2 7/2003 Wu et al.
6,649,497 B2 11/2003 Ring
6,727,531 B1 4/2004 Redwing et al.
6,777,278 B2 8/2004 Smith
6,849,882 B2 2/2005 Chavarkar et al.
6,867,078 B1 3/2005 Green et al.
6,946,739 B2 9/2005 Ring
6,979,863 B2 12/2005 Ryu
6,982,204 B2 1/2006 Saxler et al.
7,030,428 B2 4/2006 Saxler
7,045,404 B2 5/2006 Sheppard et al.
7,071,498 B2 7/2006 Johnson et al.
7,084,475 B2 8/2006 Shelton et al.
7,125,786 B2 10/2006 Ring et al.
7,161,194 B2 1/2007 Parikh et al.
7,170,111 B2 1/2007 Saxler
7,230,284 B2 6/2007 Parikh et al.
7,238,560 B2 7/2007 Sheppard et al.
7,253,454 B2 8/2007 Saxler
7,265,399 B2 9/2007 Sriram et al.
7,268,375 B2 9/2007 Shur et al.
7,304,331 B2 12/2007 Saito et al.
7,321,132 B2 1/2008 Robinson et al.
7,326,971 B2 2/2008 Harris et al.
7,332,795 B2 2/2008 Smith et al.
7,364,988 B2 4/2008 Harris et al.
7,388,236 B2 6/2008 Wu et al.
7,419,892 B2 9/2008 Sheppard et al.
7,432,142 B2 10/2008 Saxler et al.
7,456,443 B2 11/2008 Saxler et al.
7,465,967 B2 12/2008 Smith et al.
7,501,669 B2 3/2009 Parikh et al.
7,544,963 B2 6/2009 Saxler
7,547,925 B2 6/2009 Wong et al.
7,548,112 B2 6/2009 Sheppard
7,550,783 B2 6/2009 Wu et al.
7,550,784 B2 6/2009 Saxler et al.
7,566,580 B2 7/2009 Keller et al.
7,566,918 B2 7/2009 Wu et al.
7,573,078 B2 8/2009 Wu et al.
7,592,211 B2 9/2009 Sheppard et al.
7,598,108 B2 10/2009 Li et al.
7,612,390 B2 11/2009 Saxler et al.
7,615,774 B2 11/2009 Saxler
7,638,818 B2 12/2009 Wu et al.
7,678,628 B2 3/2010 Sheppard et al.
7,692,263 B2 4/2010 Wu et al.
7,709,269 B2 5/2010 Smith et al.
7,709,859 B2 5/2010 Smith et al.
7,745,851 B2 6/2010 Harris
7,759,700 B2 7/2010 Ueno et al.
7,777,252 B2 8/2010 Sugimoto et al.
7,777,254 B2 8/2010 Sato
7,795,642 B2 9/2010 Suh et al.
7,812,369 B2 10/2010 Chini et al.
7,855,401 B2 12/2010 Sheppard et al.
7,875,537 B2 1/2011 Suvorov et al.
7,875,914 B2 1/2011 Sheppard
7,892,974 B2 2/2011 Ring et al.
7,893,500 B2 2/2011 Wu et al.
7,901,994 B2 3/2011 Saxler et al.
7,906,799 B2 3/2011 Sheppard et al.
7,915,643 B2 3/2011 Suh et al.
7,915,644 B2 3/2011 Wu et al.
7,919,791 B2 4/2011 Flynn et al.
7,928,475 B2 4/2011 Parikh et al.
7,935,985 B2 5/2011 Mishra et al.
7,939,391 B2 5/2011 Suh et al.
7,948,011 B2 5/2011 Rajan et al.
7,955,918 B2 6/2011 Wu et al.
7,955,984 B2 6/2011 Ohki
7,960,756 B2 6/2011 Sheppard et al.
7,965,126 B2 6/2011 Honea et al.
7,985,986 B2 7/2011 Heikman et al.
8,039,352 B2 10/2011 Mishra et al.
8,049,252 B2 11/2011 Smith et al.
8,114,717 B2 2/2012 Palacios et al.
8,519,438 B2 8/2013 Mishra et al.
2001/0032999 A1 10/2001 Yoshida
2001/0040247 A1 11/2001 Ando et al.
2002/0036287 A1 3/2002 Yu et al.
2002/0121648 A1 9/2002 Hsu et al.
2002/0167023 A1 11/2002 Chavarkar et al.
2003/0003724 A1 1/2003 Uchiyama et al.
2003/0006437 A1 1/2003 Mizuta et al.
2003/0020092 A1 1/2003 Parikh et al.
2004/0041169 A1 3/2004 Ren et al.
2004/0061129 A1 4/2004 Saxler et al.
2004/0164347 A1 8/2004 Zhao et al.
2005/0077541 A1 4/2005 Shen et al.
2005/0133816 A1 6/2005 Fan et al.
2005/0189561 A1 9/2005 Kinzer et al.
2005/0189562 A1 9/2005 Kinzer et al.
2005/0194612 A1 9/2005 Beach
2005/0253168 A1 11/2005 Wu et al.
2005/0274977 A1 12/2005 Saito et al.
2006/0011915 A1 1/2006 Saito et al.
2006/0043499 A1 3/2006 De Cremoux et al.
2006/0060871 A1 3/2006 Beach
2006/0076677 A1 4/2006 Daubenspeck et al.
2006/0102929 A1 5/2006 Okamoto et al.
2006/0108602 A1 5/2006 Tanimoto
2006/0121682 A1 6/2006 Saxler
2006/0124962 A1 6/2006 Ueda et al.
2006/0157729 A1 7/2006 Ueno et al.
2006/0186422 A1 8/2006 Gaska et al.
2006/0189109 A1 8/2006 Fitzgerald
2006/0202272 A1 9/2006 Wu et al.
2006/0220063 A1 10/2006 Kurachi et al.
2006/0226442 A1 10/2006 Zhang et al.
2006/0255364 A1 11/2006 Saxler et al.
2006/0289901 A1 12/2006 Sheppard et al.
2007/0007547 A1 1/2007 Beach
2007/0018187 A1 1/2007 Lee et al.
2007/0018199 A1 1/2007 Sheppard et al.
2007/0018210 A1 1/2007 Sheppard
2007/0045670 A1 3/2007 Kuraguchi
2007/0080672 A1 4/2007 Yang
2007/0128743 A1 6/2007 Huang et al.
2007/0132037 A1 6/2007 Hoshi et al.
2007/0134834 A1 6/2007 Lee et al.
2007/0145390 A1 6/2007 Kuraguchi
2007/0158692 A1 7/2007 Nakayama et al.
2007/0164315 A1 7/2007 Smith et al.
2007/0164322 A1 7/2007 Smith et al.
2007/0194354 A1 8/2007 Wu et al.
2007/0205433 A1 9/2007 Parikh et al.
2007/0224710 A1 9/2007 Palacios et al.
2007/0228477 A1 10/2007 Suzuki et al.
2007/0278518 A1 12/2007 Chen et al.
2007/0295985 A1 12/2007 Weeks, Jr. et al.
2008/0054247 A1 3/2008 Eichler et al.
2008/0073670 A1 3/2008 Yang et al.
2008/0087897 A1* 4/2008 Iwakami ............... H01L 29/452
257/76
2008/0093621 A1 4/2008 Takeda et al.
2008/0093626 A1 4/2008 Kuraguchi
2008/0111144 A1 5/2008 Fichtenbaum et al.
2008/0157121 A1 7/2008 Ohki
2008/0203430 A1 8/2008 Simin et al.
2008/0230784 A1 9/2008 Murphy
2008/0237606 A1 10/2008 Kikkawa et al.
2008/0237640 A1 10/2008 Mishra et al.
2008/0274574 A1 11/2008 Yun

(56) References Cited

U.S. PATENT DOCUMENTS

2008/0283844 A1 11/2008 Hoshi et al.
2008/0296618 A1 12/2008 Suh et al.
2008/0308813 A1 12/2008 Suh et al.
2009/0001409 A1 1/2009 Takano et al.
2009/0032820 A1 2/2009 Chen
2009/0032879 A1 2/2009 Kuraguchi
2009/0045438 A1 2/2009 Inoue et al.
2009/0065810 A1 3/2009 Honea et al.
2009/0072240 A1 3/2009 Suh et al.
2009/0072269 A1 3/2009 Suh et al.
2009/0072272 A1 3/2009 Suh et al.
2009/0075455 A1 3/2009 Mishra
2009/0085065 A1 4/2009 Mishra et al.
2009/0140262 A1 6/2009 Ohki et al.
2009/0146185 A1 6/2009 Suh et al.
2009/0201072 A1 8/2009 Honea et al.
2009/0267078 A1 10/2009 Mishra et al.
2009/0278144 A1 11/2009 Sonobe et al.
2010/0019225 A1 1/2010 Lee
2010/0019279 A1 1/2010 Chen et al.
2010/0065923 A1 3/2010 Charles et al.
2010/0067275 A1 3/2010 Wang et al.
2010/0133506 A1 6/2010 Nakanishi et al.
2010/0140660 A1 6/2010 Wu et al.
2010/0201439 A1 8/2010 Wu et al.
2010/0203234 A1 8/2010 Anderson et al.
2010/0219445 A1 9/2010 Yokoyama et al.
2010/0244087 A1 9/2010 Horie et al.
2010/0264461 A1 10/2010 Rajan et al.
2010/0288998 A1 11/2010 Kikuchi et al.
2011/0006346 A1* 1/2011 Ando et al. .................. 257/192
2011/0012110 A1 1/2011 Sazawa et al.
2011/0140118 A1* 6/2011 Ramdani ........................ 257/66
2011/0249359 A1 10/2011 Mochizuki et al.
2012/0168822 A1 7/2012 Matsushita
2012/0193638 A1 8/2012 Keller et al.
2012/0211800 A1 8/2012 Boutros
2012/0217512 A1 8/2012 Renaud
2012/0315445 A1 12/2012 Mizuhara et al.
2013/0015498 A1* 1/2013 Briere .......................... 257/191

FOREIGN PATENT DOCUMENTS

CN 103477543 12/2013
CN 103493206 1/2014
EP 1998376 A1 12/2008
JP 11-224950 8/1999
JP 2004-260114 A 9/2004
JP 2006-32749 A 2/2006
JP 2010-087076 4/2010
TW 200947703 11/2009
TW 201010076 3/2010
TW 201027759 A 7/2010
WO WO 2004/070791 8/2004
WO WO 2004/098060 11/2004
WO WO 2005/070007 8/2005
WO WO 2005/070009 8/2005
WO WO 2006/114883 11/2006
WO WO 2007/077666 A1 7/2007
WO WO 2007/108404 A1 9/2007
WO WO 2008/120094 A2 10/2008
WO WO 2009/076076 A2 6/2009
WO WO 2009/132039 A2 10/2009
WO WO 2010/068554 A2 6/2010
WO WO 2010/132587 A2 11/2010
WO WO 2011/031431 A2 3/2011
WO WO 2011/072027 A2 6/2011
WO WO 2013/052833 4/2013

OTHER PUBLICATIONS

Palacios et al., "Fluorine treatment to shape the electric field in electron devices, passivate dislocations and point defects, and enhance the luminescence efficiency of optical devices," U.S. Appl. No. 60/736,628, filed Nov. 15, 2005, 21 pages.

Keller et al., "Method for heteroepitaxial growth of high quality N-Face GaN, InN and AlN and their alloys by metal organic chemical vapor deposition," U.S. Appl. No. 60/866,035, filed Nov. 15, 2006, 31 pages.

Mishra et al., "N-face high electron mobility transistors with low buffer leakage and low parasitic resistance," U.S. Appl. No. 60/908,914, filed Mar. 29 ,2007, 21 pages.

Chang Soo Suh et al., "High Breakdown Enhancement Mode GaN-Based HEMTs With Integrated Slant Field Plate", U.S. Appl. No. 60/822,886, filed Aug. 18, 2006, 16 pages.

Chang Soo Suh et al., "III-Nitride Devices with Recessed Gates", U.S. Appl. No. 60/972,481, filed Sep. 14, 2007, 18 pages.

Mishra et al., "Growing N-polar III-nitride Structures", U.S. Appl. No. 60/972,467, filed Sep. 14, 2007, 7 pages.

Ando et al., "10-W/mm AlGaN-GaN HFET with a field modulating plate," *IEEE Electron Device Letters,* 24(5): 289-291, (May 2003).

Arulkumaran et al., "Surface passivation effects on AlGaN/GaN high-electron-mobility-transistors with SiO[sub 2], Si[sub 3]N[sub 4], and silicon oxynitride," *Applied Physics Letters,* 84(4):613-615, (Jan. 2004).

Chen et al., "High-performance AlGaN/GaN lateral field-effect rectifiers compatible with high electron mobility transistors," *Applied Physics Letters,* vol. 92, Issue 25, 3 pages, (2008).

Chu, "1200-V Normally Off GaN-on-Si Field-Effect Transistors With Low Dynamic ON-Resistance." *IEEE Electron Device Letters,* 32(5):632-634, (May 2011).

Coffie et al., "Unpassivated p-GaN/AlGaN/GaN HEMTs with 7.1 W/mm at 10 GHz," *Electronic Letters,* 39(19): 1419-1420, (Sep. 2003).

Coffie, Characterizing and Suppressing DC-to-RF Dispersion in AlGaN/GaN High Electron Mobility Transistors, *Dissertation,* University of California, Santa Barbara, 169 pages, (Dec. 2003).

Dora et al., "High Breakdown Voltage Achieved on AlGaN/GaN HEMTs with Integrated Slant Field Plates," *IEEE Electron Device Letters,* 27(9):713-715, (Sep. 2006).

Dora et al., "Zr0[sub2] gate dielectrics produced by ultraviolet ozone oxidation for GaN and AlGaN/GaN transistors," *J. Vac. Sci. Technol.,* B 24(2):575-581 (Mar./Apr. 2006).

Dora, "Understanding Material and Process Limits for High Breakdown Voltage AlGaN/GaN HEMTs," *Dissertation,* University of California, Santa Barbara, (Mar. 2006).

Fanciulli et al., "Structural and Electrical Properties of Hf02 Films Grown by Atomic Layer Deposition on Si, Ge, GaAs and GaN", *Mat. Res. Soc. Symp. Proc.* vol. 786, pp. E6.I4.I-.E6.I4.6 (2004).

Green et al., "The effect of surface passivation on the microwave characteristics of undoped AlGaN/GaN HEMT's," *IEEE Electron Device Letters,* 21(6): 268-270, (Jun. 2000).

Gu et al., "AlGaN/GaN MOS transistors using crystalline Zr0[sub2] as gate dielectric", *Proceedings of SPIE,* vol. 6473, 64730S-1, 8 pages, (2007).

Higashiwaki et al., "AlGaN/GaN Heterostructure Field-Effect Transistors on 4H-SiC Substrates with Current-Gain Cutoff Frequency of 190 GHz." *Applied Physics Express* 1, pp. 021103-1 through 021103-3, (2008).

Hwang et al., "Effects of a Molecular Beam Epitaxy Grown AIN Passivation Layer on AlGaN/GaN Heterojunction Field Effect Transistors," *Solid-State Electronics,* 48(2):363-366, (2004).

Im et al., "Normally Off GaN MOSFET Based on AlGaN/GaN Heterostructure With Extremely High 2DEG Density Grown on Silicon Substrate," *IEEE Electron Device Letters,* 31(3):192-194, (Mar. 2010).

International Application No. PCT/US2009/066647, International Preliminary Report on Patentability, 12 pages, issued Jun. 14, 2011.

International Application No. PCT/US2008/076030, International Preliminary Report on Patentability, 5 pages, issued Mar. 16, 2010.

International Application No. PCT/US2008/076079, International Preliminary Report on Patentability, 6 pages, issued Mar. 24, 2010.

International Application No. PCT/US2008/076160, International Preliminary Report on Patentability, 6 pages, issued Mar. 16, 2010.

International Application No. PCT/US2008/076160, International Search Report and Written Opinion, 11 pages, mailed Mar. 18, 2009.

International Application No. PCT/US2008/076199, International Preliminary Report on Patentability, 6 pages, issued Mar. 24, 2010.

(56) References Cited

OTHER PUBLICATIONS

International Application No. PCT/US2008/085031, International Preliminary Report on Patentability, 6 pages, issued Jun. 15, 2010.
International Application No. PCT/US2009/041304, International Preliminary Report on Patentability, 8 pages, issued Oct. 26, 2010.
International Application No. PCT/US2009/041304, International Search Report and Written Opinion, 13 pages, mailed Dec. 18, 2009.
International Application No. PCT/US2009/057554, International Preliminary Report on Patentability, 7 pages, issued Mar. 29, 2011.
International Application No. PCT/US2009/057554, International Search Report and Written Opinion, 13 pages, mailed May 10, 2010.
International Application No. PCT/US2009/066647, International Search Report and Written Opinion, 16 pages, mailed Jul. 1, 2010.
International Application No. PCT/US2010/021824, International Preliminary Report on Patentability, 6 pages, issued Aug. 9, 2011.
International Application No. PCT/US2010/021824, International Search Report and Written Opinion, 9 pages, mailed Aug. 23, 2010.
International Application No. PCT/US2010/034579, International Preliminary Report on Patentability, 6 pages, issued Nov. 15, 2011.
International Application No. PCT/US2010/034579, International Search Report and Written Opinion, 9 pages, mailed Dec. 24, 2010.
International Application No. PCT/US2010/046193, International Preliminary Report on Patentability, 10 pages, issued Feb. 28, 2012.
International Application No. PCT/US2010/046193, International Search Report and Written Opinion, 13 pages, mailed Apr. 26, 2011.
International Application No. PCT/US2010/059486, International Preliminary Report on Patentability, 7 pages, issued Jun. 12, 2012.
International Application No. PCT/US2010/059486, International Search Report and Written Opinion, 9 pages, mailed Jul. 27, 2011.
International Search Report and Written Opinion of the International Searching Authority, International Application Serial No. PCT/US2008/076079, 11 pages, mailed Mar. 20, 2009.
International Search Report and Written Opinion of the International Searching Authority, International Application Serial No. PCT/US2008/076199, 11 pages, mailed Mar. 24, 2009.
International Search Report and Written Opinion of the International Searching Authority, International Application Serial No. PCT/US2009/076030, 10 pages, mailed Mar. 23, 2009.
International Search Report and Written Opinion of the International Searching Authority, International Application Serial No. PCT/US2008/085031, 11 pages, mailed Jun. 24, 2009.
Karmalkar and Mishra, "Enhancement of breakdown voltage in AlGaN/GaN high electron mobility transistors using a field plate," *IEEE Transactions on Electron Devices,* 48(8):1515-1521, (Aug. 2001).
Karmalkar and Mishra, "Very high voltage AlGaN/GaN high electron mobility transistors using a field plate deposited on a stepped insulator," *Solid State Electronics,* 45(9):1645-1652, (2001).
Keller et al., "GaN-GaN junctions with ultrathin AIN interlayers: Expanding heterojunction design," *Applied Physics Letters,* 80(23):4387-4389, (Jun. 2002).
Khan et al., "AlGaN/GaN metal oxide semiconductor heterostructure field effect transistor," *IEEE Electron Device Letters,* 21(2):63-65, (Feb. 2000).
Kim, "Process Development and Device Characteristics of AlGaN/GaN HEMTs for High Frequency Applications," *Dissertation,* University of Illinois at Urbana-Champaign, 120 pages, (2007).
Kumar et al., "High transconductance enhancement-mode AlGaN/GaN HEMTs on SiC substrate," *Electronics Letters,* 39(24):1758-1760, (Nov. 2003).
Kuraguchi et al., "Normally-off GaN-Misfet with well-controlled threshold voltage." *Phys. Stats. Sol.,* 204(6):2010-2013, (2007).
Lanford et al., "Recessed-gate enhancement-mode GaN HEMT with high threshold voltage", *Electronics Letters,* 41(7):449-450, (Mar. 2005).
Lee et al., "Self-aligned process for emitter- and base-regrowth GaN HBTs and BJTs," *Solid-State Electronics,* 45(2):243-247, (Feb. 2001).
Mishra et al., "AlGaN/GaN HEMTs—An Overview of Device Operation and Applications, " *Proceedings of the IEEE,* 90(6):1022-1031, (Jun. 2002).
Nanjo et al., "Remarkable Breakdown Voltage Enhancement in AlGaN Channel High Electron Mobility Transistors," *Applied Physics Letters,* vol. 92, pp. 263502-1 through 263502-3, (2008).
Office Action for Chinese App No. 200880120050.6, 10 pages, issued Aug. 2, 2011.
Ota and Nozawa, "AlGaN/GaN recessed MIS-Gate HFET with high threshold-voltage normally-off operation for power electronics applications," *IEEE Electron Device Letters,* 29(7):668-670, (Jul. 2008).
Palacios et al., "AlGaN/GaN HEMTs with an InGaN-based back-barrier," *Device Research Conference Digest,* vol. 1, pp. 181-182, (Jun. 2005).
Palacios et al., "AlGaN/GaN High Electron Mobility Transistors With InGaN Back-Barriers," *IEEE Electron Device Letters,* 27(1):13-16, (Jan. 2006).
Palacios et al., "Nitride-based high electron mobility transistors with a GaN spacer," *Applied Physics Letters,* 89(1):073508-1 through 073508-3, (2006).
Pei et al., "Effect of Dielectric Thickness on Power Performance of AlGaN/GaN HEMTs," *IEEE Electron Device Letters,* 30(4):313-315, (Apr. 2009).
"Planar, Low Switching Loss, Gallium Nitride Devices for Power Conversion Applications," SBIR/STTR N121-090 (Navy). Retrieved from the Internet< URL: http://dodsbir.net/sitis/display_topic.asp?Bookmark=42087>, 3 pages, retrieved on Jan. 6, 2012.
Rajan et al., "Advanced transistor structures based on N-face GaN," 32M International Symposium on Compound Semiconductors (ISCS). Sep. 18-22, 2005, Europa-Park Rust, Germany, 2 pages, (Sep. 2005).
Saito et al., "Recess-Gate Structure Approach Toward Normally Off High—Voltage AlGaN/GaN HEMT for Power Electronics Applications," *IEEE Transactions on Electron Device,* 53(2):356-362, (Feb. 2006).
Shelton et al., "Selective area growth and characterization of AlGaN/GaN heterojunction bipolar transistors by metalorganic chemical vapor deposition," *IEEE Transactions on Electron Devices,* 48(3):490-494, (Mar. 2001).
Shen, "Advanced Polarization-Based Design of AlGaN/GaN HEMTs," *Dissertation,* University of California, Santa Barbara, 192 pages, (Jun. 2004).
Sugiura et al., "Enhancement-mode n-channel GaN MOSFETs fabricated on p-GaN using Hf0[sub2] as gate oxide," *Electronics Letters,* 43(17):952-953, (Aug. 2007).
Suh, "High-Breakdown Enhancement-Mode AlGaN/GaN HEMTs with Integrated Slant Field-Plate," *Electron Devices Meeting,* 2006. IEDM '06. International, 3 pages, (2006).
Tipirneni, "Silicon Dioxide-Encapsulated High-Voltage AlGaN/GaN HFETs for Power-Switching Applications," *IEEE Electron Device Letters* 28(9):784-786, (Sep. 2007).
Vetury et al., Direct Measurement of Gate Depletion in High Breakdown (405V) AlGaN/GaN Heterostructure Field Effect Transistors, Electron Devices Meeting, 1998. IEDM '98 Technical Digest., International, pp. 55-58, (1998).
Wang et al., "Enhancement-Mode Si[sub 3]N[sub 4]/AlGaN/GaN MISHFETs." *IEEE Electron Device Letters,* 27(10):793-795, (Oct. 2006).
Wang et al., "Comparison of the effect of gate dielectric layer on 2DEG carrier concentration in strained AlGaN/GaN heterostructure", *Mater. Res. Soc. Symp. Proc.,* vol. 831, 6 pages, (2005).
Wu et al., "A 97.8% Efficient GaN HEMT Boost Converter With 300-W Output Power at 1 MHz." *IEEE Electron Device Letters,* 29(8):824-826, (Aug. 2008).
Wu et al., "AlGaN/GaN Microwave Power High-Mobility-Transistors," *Dissertation,* University of California, Santa Barbara, 134 pages, (Jul. 1997).

(56) References Cited

OTHER PUBLICATIONS

Yoshida, "AlGaN/GaN Power FET," Furukawa Review, No. 21, pp. 7-11, (2002).
Zhang, "High Voltage GaN HEMTs with low on-resistance for switching applications," *Dissertation,* University of California, Santa Barbara, 166 pages, (Sep. 2002).
European Search Report in Application No. 10 81 5813.0, mailed Mar. 12, 2013, 9 pages.
Authorized officer Tae Hoon Kim, International Search Report and Written Opinion in PCT/US2013/035837, mailed Jul. 30, 2013, 9 pages.
Authorized officer Hye Lyun Park, International Search Report and Written Opinion in PCT/US2013/050914, mailed Oct. 18, 2013, 11 pages.
Authorized officer Kwan Sik Sul, International Search Report and Written Opinion in PCT/US2011/063975, mailed May 18, 2012, 8 pages.
Authorized officer Sang-Taek Kim, International Search Report and Written Opinion in PCT/US2011/061407, mailed May 22, 2012, 10 pages.
Authorized officer Kwan Sik Sul, International Search Report and Written Opinion in PCT/US2012/023160, mailed May 24, 2012, 9 pages.
Authorized officer Jeongmin Choi, International Search Report and Written Opinion in PCT/US2012/027146, mailed Sep. 24, 2012, 12 pages.
Napierala et al. (2006), "Selective GaN Epitaxy on Si(111) Substrates Using Porous Aluminum Oxide Buffer Layers," Journal of the Electrochemical Society, 153(2):G125-G127, 4 pages.
Search Report and Action in TW Application No. 098132132, issued Dec. 6, 2012, 8 pages.
SIPO First Office Action for Application No. 200980114639.X, issued May 14, 2012, 13 pages.
Zhanghong Content, Shanghai Institute of Metallurgy, Chinese Academy of Sciences, "Two-dimensional Electron Gas and High Electron Mobility Transistor (HEMT)," Dec. 31, 1984, 17 pages.

* cited by examiner

III-N DEVICE STRUCTURES HAVING A NON-INSULATING SUBSTRATE

TECHNICAL FIELD

The disclosed technology relates to semiconductor electronic devices, and specifically to nitride-based devices grown on non-insulating substrates.

BACKGROUND

As large native substrates for group III-Nitride (III-N) semiconductors are not yet widely available, III-N films, such as GaN and its alloys, are currently grown by heteroepitaxy on suitable non-III-N substrates. Typically, the films are grown on sapphire ($Al_2O_3$), silicon carbide (SiC), or silicon substrates. Silicon substrates are emerging as a particularly attractive substrate candidate for III-N layers due to their low cost, wide availability, large wafer sizes, thermal properties, and ease of integration with silicon-based electronics. However, due to the large lattice mismatch and thermal expansion coefficient mismatch between silicon and III-N materials, there is typically a net tensile stress in III-N epitaxial layers deposited directly on silicon substrates.

This mismatch can result in cracking of the layers and thus thick III-N layers on silicon substrates that are crack-free and that exhibit adequate structural quality can be difficult to achieve. For example, the maximum thickness of III-N layers that can be grown without sustaining substantial defects may be limited. If the III-N layers are grown too thick, tensile stress in the layer becomes substantial, which can cause cracking upon cooling. In many applications in which III-N heteroepitaxial layers are used, it may be necessary that substantially thick III-N layers of adequate quality be grown on the foreign substrates.

SUMMARY

In one aspect, a III-N device is described. The III-N device includes a first material layer having a first side and a second side opposite the first side, and a first III-N material layer on the first side of the first material layer, the first III-N material layer including a channel layer. The III-N device further includes a second III-N material layer on the first III-N material layer, and a barrier layer disposed on the second side of the first material layer. The barrier layer is less electrically conductive than the first material layer.

In another aspect, a III-N device is described. The III-N device includes a substrate layer having a first side and a second side opposite the first side, and a III-N material layer on the first side of the substrate layer, the substrate layer being electrically non-insulating. The III-N device further includes a diode structure in contact with the second side of the substrate layer, and a conductive portion of a device package in contact with a side of the diode structure opposite the substrate layer. The conductive portion of the device package is configured to be connected to ground.

In yet another aspect, a III-N device is described. The III-N device includes a substrate layer having a first side and a second side opposite the first side, a first III-N material layer on the first side of the substrate layer, the first III-N material layer including a channel layer, and a second III-N material layer on the first III-N material layer. The substrate layer includes or is formed as a diode structure, the diode structure having a polarity to prevent current conduction through the substrate layer from the first side to the second side of the substrate layer.

III-N devices described herein can include one or more of the following. The device can further comprise an electrically conductive layer on a side of the barrier layer opposite the first material layer. The electrically conductive layer can be a portion of a device package. The electrically conductive layer can be configured to be grounded or connected to a ground. The barrier layer can be configured to reduce, relative to a device lacking the barrier layer, a leakage current from the channel layer to the electrically conductive layer during device operation. The first material layer can be a conductive or partially conductive substrate. The substrate can include a material selected from the group consisting of silicon, silicon carbide (SiC), and gallium nitride (GaN). The first material layer can be a conductive or partially conductive carrier wafer. The device can further include a nucleation layer formed on the first material layer and a stress management layer formed on the nucleation layer, where the first III-N material layer is formed on the stress management layer. The barrier layer can be bonded to the first material layer. The channel layer can include a conductive channel. The barrier layer can include or be formed of high electrical resistivity material. The barrier layer can include or be formed of electrically insulating material. The barrier layer can include or be formed of thermally conductive material. The barrier layer can include or be formed of AlN or a ceramic material. A compositional difference between the first III-N material layer and the second III-N material layer can induce a 2DEG channel in the first III-N material layer. The device can further include a source contact, a drain contact, and a gate, the gate being adjacent to the second III-N material layer, and the source contact and drain contact being in electrical contact with the 2DEG, with the device being an enhancement mode FET. The device can further include a source contact, a drain contact and a gate, the gate being in contact with the second III-N material layer, and the source contact and drain contact being in electrical contact with the 2DEG, with the device being a depletion mode FET. The device can further include a source contact, a drain contact, and a gate, with the source and drain contacts and gate being over a side of the second III-N material layer opposite the first III-N material layer. The device can further include an anode contacting at least one of the first and second III-N material layers and a cathode contacting the 2DEG channel, the device being a diode.

The diode structure can be configured to substantially prevent device leakage current from flowing through the substrate layer from the first side to the second side. The substrate layer can include or be formed of a material selected from the group consisting of silicon, SiC, and GaN. A first portion of the diode structure proximate to the substrate layer can be of a first conductivity type, and a second portion of the diode structure distal from the substrate layer can be of a second conductivity type. The first conductivity type can be n-type, and the second conductivity type can be p-type. The III-N material layer can include a first III-N material layer and a second III-N material layer adjacent to the first III-N material layer, where a compositional difference between the first III-N material layer and the second III-N material layer induces a 2DEG channel in the first III-N material layer. The device can further include a source contact, a drain contact, and a gate, the source and drain contacts and the gate being over a side of the III-N material layer opposite the substrate layer.

A first portion of the diode structure adjacent to the first side can be of a first conductivity type, and a second portion of the diode structure adjacent to the second side can be of a second conductivity type. The first conductivity type can be n-type, and the second conductivity type can be p-type. The diode structure can be configured to be reverse biased during device operation. The device can further include a source contact, a drain contact, and a gate, the source and drain contacts and gate being over a side of the second III-N material layer opposite the substrate layer. A compositional difference between the first III-N material layer and the second III-N material layer can induce a 2DEG channel in the first III-N material layer. The device can further include a nucleation layer formed on the substrate layer. The device can further include a stress management layer disposed on the nucleation layer, where the first III-N material layer is formed on the stress management layer.

In still another aspect, a method of forming or producing a III-N device is described. The method includes forming a first III-N material layer and a second III-N material layer, the first III-N material layer including a channel layer. The first and second III-N material layers are over a first side of a first material layer, the first III-N material layer being between the second III-N material layer and the first material layer. The method further includes forming a barrier layer on a second side of the first material layer, the second side of the first material layer being opposite the first side of the first material layer. The barrier layer can be less electrically conductive than the first material layer.

Methods of forming or producing a III-N device can include one or more of the following. The first material layer can be a substrate, and forming the first and second III-N material layers can include forming the first and second III-N material layers over the first side of the first material layer by epitaxial growth or deposition. Forming the first and second III-N material layers can include forming the first and second III-N material layers on a substrate, removing the substrate from the first and second III-N material layers, and joining the first and second III-N material layers to the first side of the first material layer. The first material layer can be a carrier wafer. The method can further include forming a nucleation layer on the first side of the first material layer and forming a stress management layer on the nucleation layer, whereby the first III-N material layer is joined to the stress management layer. The device can be encapsulated in a package that surrounds the device, including joining the barrier layer to an electrically conductive package base of the package. The method can further include adding a gate over the first or second III-N material layer and adding source and drain electrodes on opposite sides of the gate. The method can further include adding a cathode contacting the channel layer of the first III-N material layer and adding an anode contacting the first or second III-N material layer.

Devices and methods described herein can reduce leakage currents in semiconductor power devices, as well as increasing breakdown voltages in such devices.

BRIEF DESCRIPTION OF DRAWINGS

Like reference symbols in the various drawings indicate like elements.

DETAILED DESCRIPTION

Figure 1:
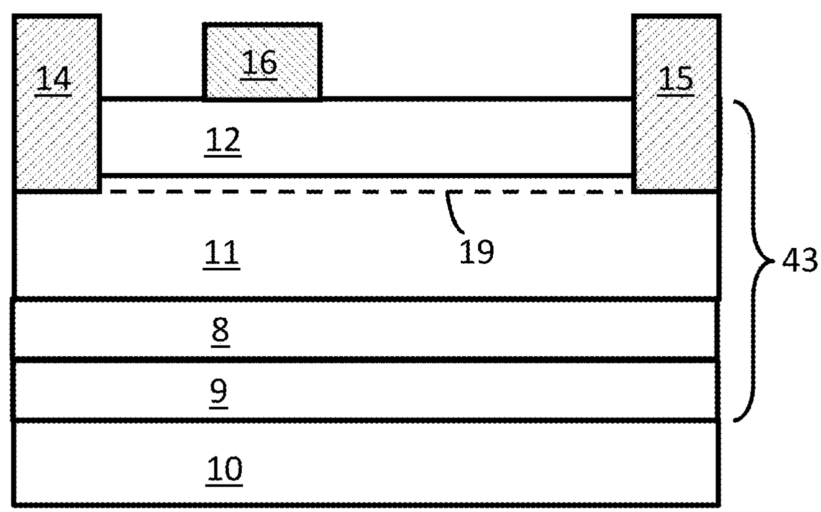
FIG. 1 is a cross-sectional view of an example of a III-N high electron mobility transistor (HEMT) device.

The following description and drawings are illustrative and are not to be construed as limiting. Numerous specific details are described to provide a thorough understanding of the disclosure. However, in certain instances, well-known or conventional details are not described in order to avoid obscuring the description. References to one or an embodiment in the present disclosure can be, but not necessarily are, references to the same embodiment; and, such references mean at least one of the embodiments.

Reference in this specification to "one embodiment" or "an embodiment" means that a particular feature, structure, or characteristic described in connection with the embodiment is included in at least one embodiment of the disclosure. The appearances of the phrase "in one embodiment" in various places in the specification are not necessarily all referring to the same embodiment, nor are separate or alternative embodiments mutually exclusive of other embodiments. Moreover, various features are described which may be exhibited by some embodiments and not by others. Similarly, various requirements are described which may be requirements for some embodiments but not other embodiments.

The terms used in this specification generally have their ordinary meanings in the art, within the context of the disclosure, and in the specific context where each term is used. Certain terms that are used to describe the disclosure are discussed below, or elsewhere in the specification, to provide additional guidance to the practitioner regarding the description of the disclosure. For convenience, certain terms may be highlighted, for example using italics and/or quotation marks. The use of highlighting has no influence on the scope and meaning of a term; the scope and meaning of a term is the same, in the same context, whether or not it is highlighted. It will be appreciated that same thing can be said in more than one way.

Consequently, alternative language and synonyms may be used for any one or more of the terms discussed herein, nor is any special significance to be placed upon whether or not a term is elaborated or discussed herein. Synonyms for certain terms are provided. A recital of one or more synonyms does not exclude the use of other synonyms. The use of examples anywhere in this specification including examples of any terms discussed herein is illustrative only, and is not intended to further limit the scope and meaning of the disclosure or of any exemplified term. Likewise, the disclosure is not limited to various embodiments given in this specification.

Without intent to limit the scope of the disclosure, examples of instruments, apparatus, methods and their related results according to the embodiments of the present disclosure are given below. Note that titles or subtitles may be used in the examples for convenience of a reader, which in no way should limit the scope of the disclosure. Unless otherwise defined, all technical and scientific terms used herein have the same meaning as commonly understood by one of ordinary skill in the art to which this disclosure pertains. In the case of conflict, the present document, including definitions will control.

Embodiments of the present disclosure include structures and configurations for III-N devices or semiconductor devices having a conductive, partially conductive, semi-conductive, or otherwise non-insulating substrate.

III-N devices that involve the heteroepitaxial growth or deposition of III-N layers on foreign substrates (i.e., substrates that differ substantially in composition and/or lattice structure from that of the deposited layers), such as silicon (Si), silicon carbide (SiC), or sapphire ($Al_2O_3$), can require thick III-N layers. III-N electronic devices grown or deposited on conductive native substrates, such as n-type GaN or AlGaN, can in many cases also require thick III-N layers grown atop the substrate. It can be difficult and/or expensive, however, to grow such thick III-N layers. In the case of III-N layers grown on foreign substrates, the mismatch of lattice constants and thermal expansion coefficients, as well as chemical and structural properties, between the substrate and the III-N epitaxial layers can cause substantial stress in the layers during growth, causing the III-N layers to be in a strained state during growth. In addition, the mismatch of thermal coefficients of expansion between the III-N layers and the foreign substrates on which they are grown or deposited can cause further strain in the III-N layers as the layers are cooled from growth temperature, which is typically in the range of about 700° C.-1500° C., to room temperature.

In III-N devices grown on substrates, there can be a trade-off between the device performance and other characteristics, such as cost and scalability, for various substrates. For example, silicon or silicon-based substrates are emerging as an attractive substrate selection for III-N devices due to the low cost, wide availability, large wafer sizes, thermal and electrical properties, and ease of integration with silicon-based electronics.

However, for III-N layers grown on silicon substrates, the stress in the III-N layers becomes more tensile (and/or less compressive) as the deposited layers are cooled from growth temperature to room temperature. If the amount of stress in the film becomes too large, strain relief can occur by formation of dislocations and stacking faults, cracks in the layer, or other defects that relax the lattice strain and stabilize the layer. Furthermore, III-N devices grown on conductive or non-insulating substrates, such as silicon or n-type silicon carbide substrates, can be prone to inferior device properties, such as higher off-state leakage currents and lower breakdown voltage, as compared to devices grown on insulating or semi-insulating substrates, making them less favorable for high voltage applications. Conversely, III-N devices grown on insulating or semi-insulating substrates, such as semi-insulating silicon carbide, typically have lower sub-surface leakage currents as compared to devices grown on more conductive substrates. However, silicon carbide based III-N devices are typically disadvantageous with respect to cost and scaling.

As used herein, the terms III-Nitride or III-N materials, layers or devices refer to a material or device comprised of a compound semiconductor material according to the stoichiometric formula $Al_xIn_yGa_zN$, where x+y+z is about 1. Here, x, y, and z are compositions of Al, In and Ga, respectively. A "substrate" is a semiconductor material layer on top of which additional semiconductor material layers of a semiconductor device are deposited, for example, epitaxially grown, such that the crystalline structure of the grown semiconductor material contacting or adjacent to the substrate at least partially conforms to, or is at least partially determined by the crystalline structure of the substrate. A "semi-insulating substrate" can include a substrate with a substantially high resistivity such that there is substantially low conduction of current through the semi-insulating substrate.

FIG. 1 shows a cross-sectional view of an example of a III-N high electron mobility transistor (HEMT) fabricated on substrate 10. The III-N HEMT structure includes a substrate 10, which can be a native or a foreign substrate, a nucleation layer 9 formed on the substrate 10, such as AlN or $Al_xGa_{1-x}N$, and a buffer layer 8 disposed on the nucleation layer 9. The nucleation layer 9 can be used to control the stress during material growth and in particular, for growth of thicker layers. In some instances, a stress management layer may also be disposed over the nucleation layer for additional stress control.

The device structure further includes a channel layer 11, disposed over the buffer layer 8, and a barrier layer 12, such as a layer of $Al_xGa_{1-x}N$, formed over the channel layer 11. A two-dimensional electron gas (2DEG) channel 19 (illustrated by a dotted line) can be induced in the channel layer 11 near the interface between the channel layer 11 and the barrier layer 12. Buffer layer 8 can include a single composition III-N material which in some cases has a higher energy bandgap than that of channel layer 11. Therefore there can be an abrupt composition variation between the buffer layer 8 and the channel layer 11. For example, buffer layer 8 can include AlN or $Al_yGa_{1-y}N$, and the channel layer 11 can be GaN.

The buffer layer 8 can be graded. For example, layer 8 can include $Al_xGa_{1-x}N$ with $x \leq 1$, such that the buffer layer 8 includes a continuous grade in composition (i.e., x varies continuously throughout the layer). The composition of buffer layer 8 is graded such that the energy bandgap is greatest at the interface with substrate 10, and decreases to a minimum at the interface with the channel layer 11. In general, the effects of the tensile stress of the layer structure as it is cooled to room temperature, such as cracking or defect formation, are mitigated by use of a graded buffer layer. Careful control of the growth or deposition conditions and thickness of buffer layer 8 is utilized to minimize the negative effects of the lattice and thermal mismatches between the channel layer 11 and substrate 10.

Source and drain electrodes 14 and 15, respectively, which are formed on opposite sides of the gate electrode 16, contact the 2DEG channel 19 in channel layer 11. Gate 16 modulates the portion of the 2DEG in the gate region, i.e., beneath gate 16.

The layer structure and choice of substrate on which a III-N device is grown can affect the performance of the device. It is desirable to provide III-N devices for which superior device performance, such as high off-state operating voltage, can be achieved while at the same time maintaining scalability, cost reduction, and easy integration with other circuit components.

The transistor of FIG. 1 is a lateral device. That is, the source, gate, and drain electrodes are all on the same side of the device, for example on the top surface of the semiconductor material layers. The transistor of FIG. 1 can be a high voltage switching device, i.e., a high voltage switching transistor. As used herein, a high voltage switching transistor is a transistor optimized for high voltage switching applications. That is, when the transistor is off, it is capable of blocking high voltages, such as about 300V or higher, about 600V or higher, about 1200V or higher, or about 1700V or higher, and when the transistor is on, it has a sufficiently low on-resistance $R_{ON}$ for the application in which it is used, i.e., it experiences sufficiently low conduction loss when a substantial current passes through the device.

Figure 2:
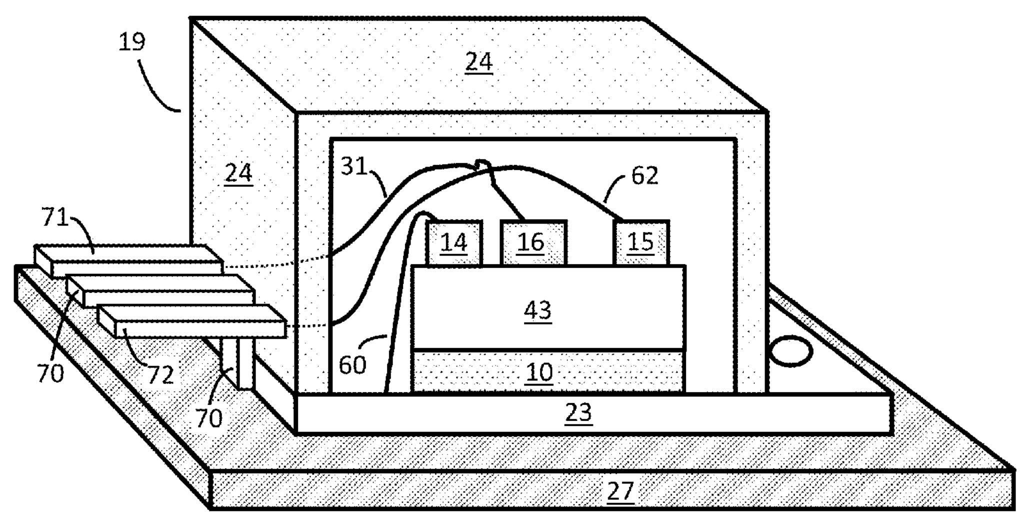
FIG. 2 is a perspective cross-sectional view of a packaged semiconductor transistor.

Referring to FIG. 2, when the transistor of FIG. 1 is configured to be used in a circuit, it can be encased, enclosed, or encapsulated in a package 19 which completely surrounds the transistor (i.e., the package can surround the transistor in three dimensions). The package 19 includes a case 24, an electrically conductive package base 23, also commonly referred to as a tab 23, a source lead 70, a gate lead 71, and a drain lead 72. Regions in the interior of the package 19 which are not occupied by the transistor are typically filled with an encapsulating material (not shown). In some applications, the package base 23 is grounded or electrically connected to ground, such as by mounting the package 19 on a ground plane 27 with the package base 23 contacting the ground plane 27. The ground plane 27 is an electrically conductive layer which is grounded or is electrically connected to ground.

Figure 3:
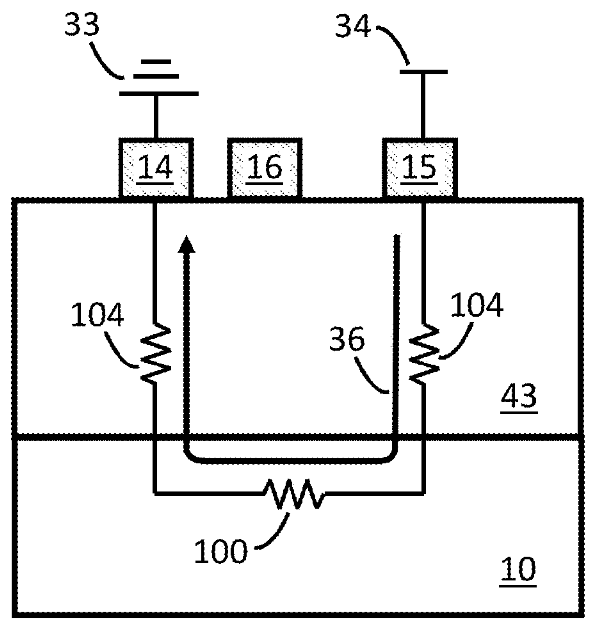
FIG. 3 is a representative circuit schematic illustrating the effective resistances in the device of FIG. 2 during off-state operation when the package base is left floating.

FIG. 3 is a representative circuit schematic illustrating the effective resistances in the device of FIG. 2 during off-state operation (i.e., operation at times where the gate 16 is biased below the threshold voltage of the device, rendering the device channel non-conductive) in applications where the package base 23 is not grounded, but is instead left floating (i.e., not electrically connected to any DC or AC voltage sources). The source electrode 14 is grounded, i.e., electrically connected to ground 33, and the drain electrode 15 is at a high voltage 34, such that the device blocks a high voltage $V_{34}$ without substantial current flowing through the device channel 19. Under these conditions, any undesirable subsurface drain leakage current 36 passing through the substrate 10 flows approximately vertically from the drain electrode 15 into the substrate 10, approximately horizontally through the substrate 10, and approximately vertically from the substrate 10 to the source electrode 14. The direction of current depicted in FIG. 3 is opposite the direction that electrons flow. The effective vertical resistance $R_{104}$ between the source electrode 14 and the substrate 10, and between the drain electrode 15 and the substrate 10, is represented in FIG. 3 by resistors 104. The effective lateral resistance $R_{100}$ through the substrate 10 is represented in FIG. 3 by resistor 100.

The magnitude of the subsurface drain leakage current 36 in FIG. 3 is inversely proportional to the effective source-drain resistance, or can be approximated by the source-drain voltage 34 divided by the effective source-drain resistance, or $V_{34}/(2*R_{104}+R_{100})$. When the substrate 10 is non-conductive or insulating, (e.g., when $R_{100}$ is greater than or much larger than $R_{104}$), the resulting subsurface drain leakage current 36 is small, and generally independent of the value of $R_{104}$. If the substrate is at least partially electrically conductive, electrically conductive, partially conductive, or otherwise non-insulating (for example if the substrate is silicon, n-type SiC, GaN, or another conductive substrate), such that $R_{100}$ is much smaller than $R_{104}$, then the effective resistance between the source 14 and drain 15 is approximately $2*R_{104}$, and so layer 43 is designed to maximize or increase $R_{104}$ to decrease or minimize the subsurface drain leakage current 36, which can be achieved by growing thicker III-N layers below the active device layers (i.e., III-N layers 11 and 12).

Referring again to FIG. 2, in applications where the package base 23 is grounded, if a substrate 10 which is electrically insulating or non-conductive is used, then the effective resistances in the device and resulting subsurface drain leakage current are about the same as those shown in FIG. 3. However, if substrate 10 is conductive or partially conductive, then the effective resistance seen by the drain is much lower, resulting in an increased subsurface drain leakage current, as further described below.

Figure 4:
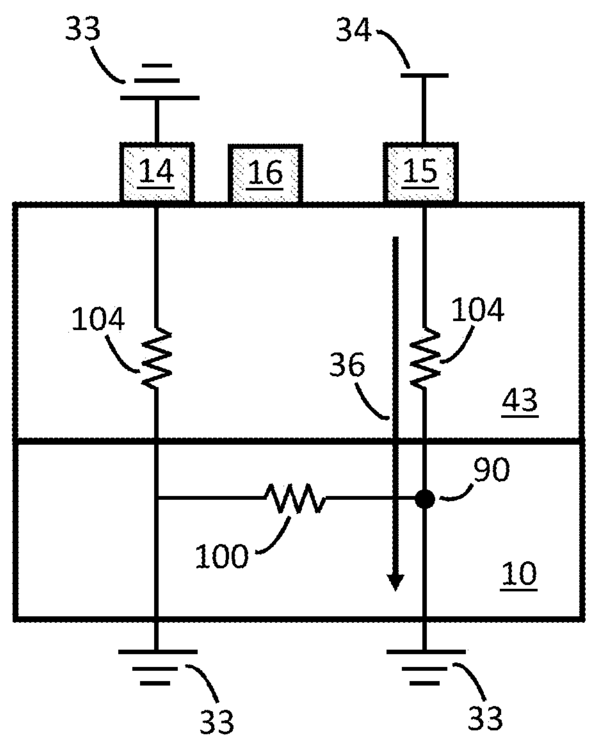
FIG. 4 is a representative circuit schematic illustrating the effective resistances in the device of FIG. 2 during off-state operation when the package base is grounded.

FIG. 4 is a representative circuit schematic illustrating the effective resistances in the device of FIG. 2 during off-state operation (i.e., operation at times where the gate 16 is biased below the threshold voltage of the device, rendering the device channel non-conductive) in applications where the package base 23 is grounded. Here, since both the source electrode 14 and node 90 are at the same voltage (i.e., both are grounded), the resistor 104 below the source electrode 14 and the substrate resistor 100 are effectively shorted. Consequently, the effective resistance between the drain electrode 15 and the source electrode 14, which is the same as the effective resistance between the drain electrode 15 and ground 33, is approximately $R_{104}$, which is approximately half the resistance seen by the drain in the case where a conductive substrate is used but the package base 23 is not grounded. This results in a larger subsurface drain leakage current 36 which can pass from the drain electrode 15 directly through the substrate to ground 33, as illustrated in FIG. 4. Alternatively, the thickness of the III-N layers below the 2DEG 19 would need to be approximately doubled to have the same drain leakage current when the package base 23 is grounded, as compared to the case where the package base 23 is not grounded.

Hence, the substrate 10, if conductive or non-insulating (e.g., silicon), can introduce a current leakage path through the substrate due to the decreased effective electrical impedance seen from the device drain. The decreased effective impedance results in increased leakage drain current through the substrate layer 10 thus negatively affecting the amount of voltage that can be applied during operation, as well as increasing off-state conduction losses. In accordance with embodiments of the present disclosure, for applications in which the package base 23 in FIG. 2 is grounded, the device structure can be modified to increase the effective impedance seen at the device drain when an electrically conducting or semiconducting substrate is used. For example, the effective impedance can be increased such that it is comparable to the effective impedance seen from the drain when the substrate is electrically conducting and the package base 23 is not grounded.

In some instances, the effective impedance can be increased by introducing insulating or less conductive material under the substrate 10, for example between the substrate 10 and the package base 23. The effective impedance can also be increased through use of a reverse biased device structure (e.g., reverse bias PN diode or PIN diode) in or below the substrate. These embodiments allow for an improvement in leakage current characteristics without need for increasing the thickness of the III-N layers in the device structure.

One embodiment of the present disclosure is a III-N semiconductor device that includes a barrier layer beneath the substrate, i.e., on a side of the substrate opposite the device and channel layers. The material for the barrier layer can be selected to be electrically insulating or otherwise substantially non-conductive to electrical current. By introducing a non-conducting material, the effective impedance seen at the device drain in applications where the package base is grounded can be increased to improve the device characteristics otherwise associated with use of a conductive substrate.

Thus, inclusion of a barrier layer can allow devices to be grown or deposited on an electrically conducting or semiconducting substrate, such as silicon, while simultaneously achieving ideal device properties for high-voltage applications, such as high breakdown voltage and low off-state leakage current, without the need to increase the thickness of the III-N layers in the device structure. An example of one embodiment of an III-N device utilizing a barrier layer to enhance or improve device characteristics by increasing the effective impedance is illustrated in FIG. 5.

Figure 5:
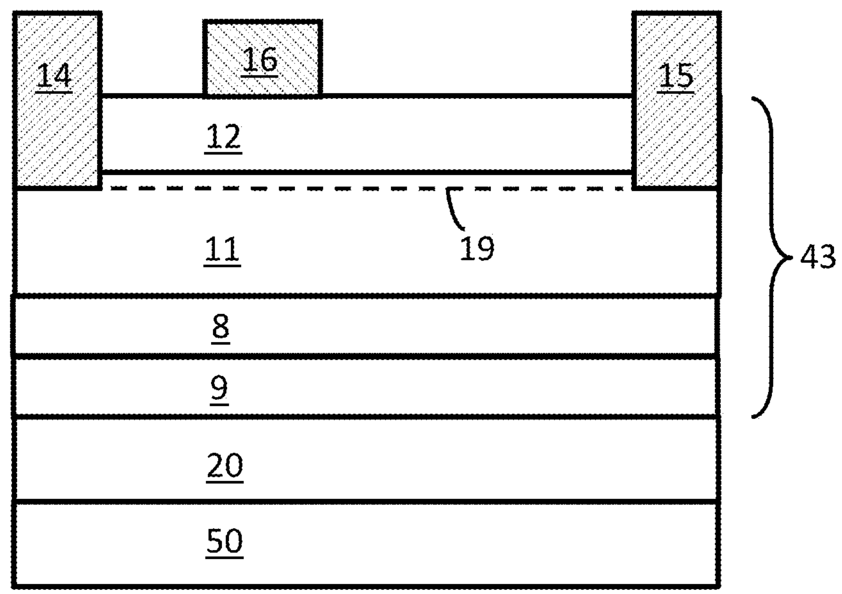
FIG. 5 is a cross-sectional view of an example of another III-N HEMT device.

FIG. 5 is a cross-sectional view of an example of a III-N HEMT device having a barrier layer 50 under a non-insulating layer 20. Non-insulating layer 20 can be a non-insulating substrate on top of which III-N layers are epitaxially grown or deposited. Or, non-insulating layer 20 can for example be a carrier wafer. That is, the III-N layers of the HEMT device can be grown on a substrate, the substrate is then removed, and a non-insulating carrier wafer can be attached or bonded to the surface exposed by the removal of the substrate. Layer 20 will herein be referred to as a substrate layer 20, although as described above, other layers are possible as well.

Figure 6:
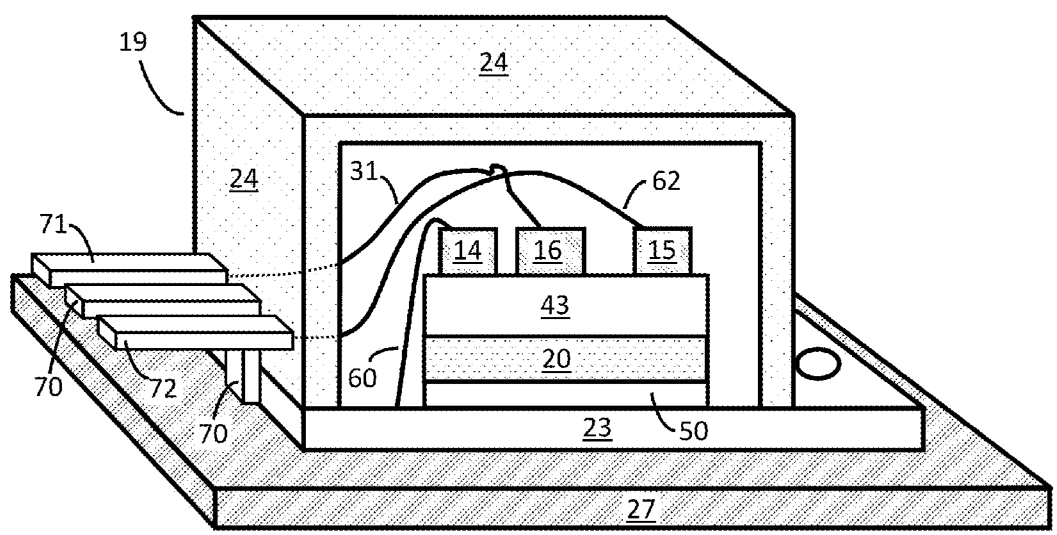
FIG. 6 is a perspective cross-sectional view of the HEMT of FIG. 5 encased in a package.

The III-N HEMT device of FIG. 5 can include a non-insulating substrate layer 20, which can be a native or foreign substrate, a first III-N material layer 11 on one side of the substrate layer 20, and a second III-N material layer 12 on the first III-N material layer 11. In general, the first III-N material layer 11 is or includes a channel layer. In one embodiment, the device includes a barrier layer 50 disposed on another side of the substrate layer 20 (e.g., a side opposite of the first and second III-N material layers). As illustrated in FIG. 6, when the III-N HEMT is encased, enclosed, or encapsulated in a package 19, the device is mounted in the package 19 such that the barrier layer 50 is disposed between the substrate layer 20 and the electrically conductive package base 23. In some embodiments, the substrate layer 20 contacts one side of the barrier layer 50 and the package base 23 contacts an opposite side of the barrier layer. In other embodiments, the barrier layer 50 is bonded to the substrate layer 20.

In general, the barrier layer 50 is less electrically conductive than the substrate layer 20, such that in applications where the package base 23 is grounded, the overall impedance seen at the drain of the device during times where the device is biased off (i.e., when the gate is biased relative to the source at a voltage which is less than the device threshold voltage) is increased by the addition of layer 50. In one embodiment, the substrate layer 20 may be electrically conductive or partially conductive. For example, substrate 20 can include or be formed of silicon, doped AlN, SiC (e.g., n-type SiC), GaN, or any another electrically conductive native or foreign substrate suitable for use in III-N devices.

Figure 7:
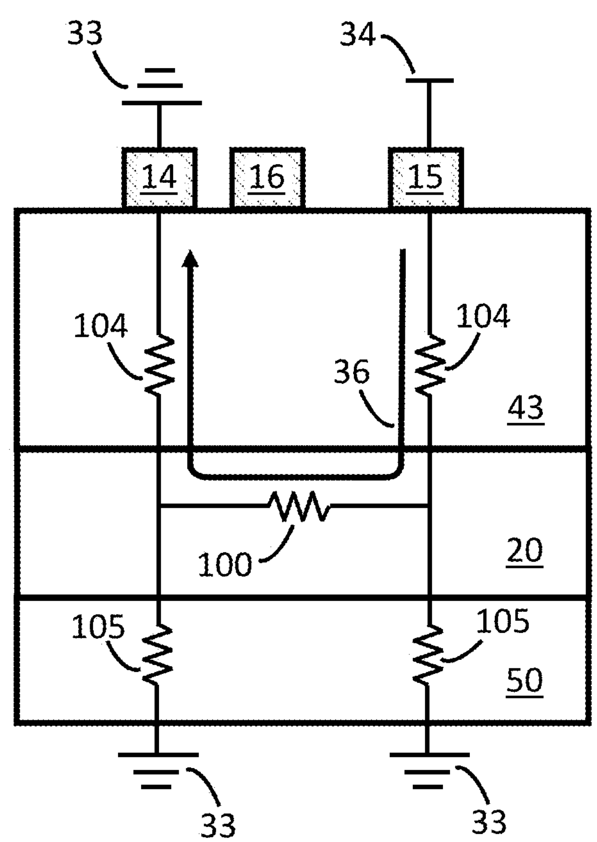
FIG. 7 is a representative circuit schematic showing the contribution to the overall resistance seen at the drain of the device of FIG. 6 during times where the gate of the device is biased off and the device blocks a high voltage.

FIG. 7 is a representative circuit schematic showing the contribution to the overall resistance seen at the drain of the device of FIG. 6 during times where the gate of the device is biased off and the device blocks a high voltage. The resistances through the barrier layer 50 below the source electrode 14 and below the drain electrode 15 are each represented by resistor 105, having a resistance $R_{105}$. If the barrier layer 50 is electrically insulating or non-conductive, $R_{105}$ is large. Assuming $R_{100}$ to be small, if $R_{105}$ is made to be larger or much larger than $R_{100}$ but smaller than $R_{104}$, the effective resistance seen at the drain $R_{drain}$ can be approximated by:

$$R_{drain}=R_{104}+[R_{104}*R_{105}/(2*R_{104}+R_{105})].$$

If barrier layer 50 is sufficiently electrically insulating or non-conductive such that $R_{105}$ is larger than both $R_{104}$ and $R_{100}$, then the effective resistance seen at the drain $R_{drain}$ is approximately $R_{drain}=2*R_{104}$, which is the same as the drain resistance in the case where the package base 23 is not grounded, and is approximately twice the drain resistance for the case where the package base 23 is grounded but a barrier layer 50 is not included. Hence, when a sufficiently insulating barrier layer 50 is used, the off-state drain leakage current in cases where the package base 23 is grounded is approximately half that of a device which lacks the barrier layer 50 but is otherwise identical.

The barrier layer 50 can be of a material such that during device operation there is substantially no current flowing through it. That is, the material and thickness of the barrier layer 50 are chosen such that substantially no current (i.e., less than 0.001 times the average on-state current of the overlying transistor device) flows through the barrier layer 50 when a voltage less than or equal to the breakdown voltage of the overlying transistor is applied across the thickness of the barrier layer 50. The minimum thickness of the barrier layer 50 depends on the particular material that is used, specifically on the number of volts that can be supported per micron of thickness of the material. In some implementations, the barrier layer 50 is at least 5 microns thick, such as between 10 microns and 300 microns thick. In other implementations, the barrier layer is at least 10 microns, at least 30 microns, or at least 100 microns thick.

The barrier layer 50 can include high electrical resistivity material or material that is otherwise electrically insulating, including by way of example but not limitation, aluminum nitride, silicon nitride, a ceramic material, amorphous SiC, $Al_2O_3$, zinc oxide (ZnO), boron nitride (BN), or any other insulating or partially insulating material. In some implementations, the barrier layer 50 can be capable of transporting or conducting substantial heat or thermal energy. For example, referring again to FIG. 6, the ground plane 27 which the package base 23 is mounted on can also serve as a heat sink to collect the heat generated in the device during device operation. As such, the heat must conduct through barrier layer 50. Hence, barrier layer can include a material that conducts heat well, or material that is thermally conductive. Furthermore, barrier layer 50 can be made thin to further enhance its total thermal conductance. In general, the thermal conductivity of barrier layer 50 is sufficiently high and the thickness is sufficiently low to conduct sufficient heat generated in the device for the particular application in which the device is used. For example, the thermal conductivity of barrier layer 50 can be greater than 1 (W/cm)/K, greater than 1.3 (W/cm)/K, or greater than 2 (W/cm)/K, and the thickness can be less than 300 microns, less than 100 microns, less than 50 microns, or less than 20 microns. In some implementations, the material of barrier layer 50 has a thermal conductivity which is greater than that of the substrate layer 20. For example, when the substrate layer 20 is silicon, which has a thermal conductivity of about 1.3 (W/cm)/K, the thermal conductivity of the barrier layer 50 can be greater than 1.3 (W/cm)/K.

The III-N layers 11 and 12 can have different compositions. For example, the compositions can be chosen such that a 2DEG channel 19 (illustrated by a dotted line) is induced in the first III-N material layer 11, which can also be referred to as "channel layer 11". To achieve the induced channel 11, some or all of the III-N material in layer 12 can have a bandgap which is larger than that of layer 11, so layer 12 can also be referred to as "barrier layer 12". For example, the first III-N material layer 11 and the second III-N material layer 12 can be GaN and $Al_xGa_{1-x}N$, respectively, where x can be between 0 and 1 or equal to 1.

One embodiment of the device includes a nucleation layer 9, such as AlN, AlGaN, or AlInGaN, formed on the substrate layer 20. The device can also include a stress management layer 8 disposed on the nucleation layer 9, with the III-N material layers that form the basis for the HEMT device (e.g., the III-N layers 11 and 12) formed on the stress management layer 8. The stress management layer 8 can include, for example, thin AlN layers, a graded or stepped $Al_xGa_{1-x}N$ layer, and/or AlGaN/GaN or AlN/GaN superlattices.

The device further includes a source contact 14, a drain contact 15 and a gate 16. The gate 16 can be adjacent to the second III-N material layer 12 and the source contact 14 and drain contact 15 are in electrical contact with the 2DEG 19. As such, the device can be a lateral device, as previously described. In general, the device can be an enhancement mode FET or a depletion mode FET. Additional examples of typical III-N devices that can be fabricated on foreign substrates and utilizing a barrier layer 50 can include, by way of example but not limitation, High Electron Mobility Transistors (HEMTs), POLFETs, MESFETs, LEDs, Diode Lasers, and Current Aperture Vertical Electron Transistors (CAVETs).

The novel art of the disclosure includes any device or structure configuration which causes the effective drain impedance to increase and is not limited to the incorporation of a barrier layer comprised of non-conductive or insulating material. For example, diode structures can be used as barriers to prevent drain leakage currents from flowing to ground directly through the substrate layer, examples of which are illustrated in FIGS. 8 and 9.

Figure 8:
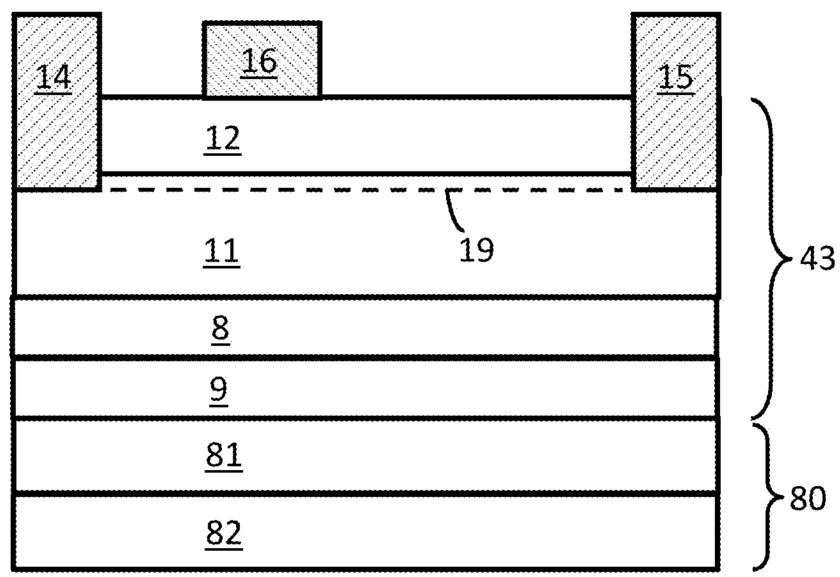
FIGS. 8 and 9 are cross-sectional views of example III-N high electron mobility transistor (HEMT) devices.
Figure 9:
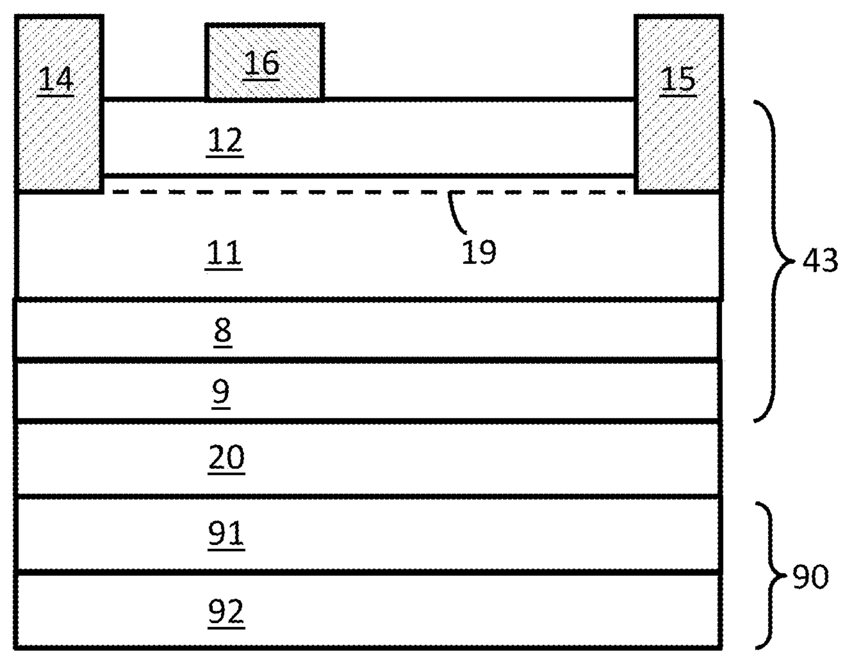

FIG. 8 is a cross-sectional view of a III-N transistor similar to that of FIG. 1, except that the substrate layer or carrier wafer 80 (herein substrate layer 80) includes or is formed as a diode structure. For example, region 81 can be an n-type semiconductor, such as n-type silicon, and region 82 can be a p-type semiconductor, such as p-type silicon, hence forming a p-n diode structure in the substrate 80.

In one embodiment, the diode structure is formed in the substrate layer through implantation. That is, the substrate layer can be implanted with dopants from an opposite side of the first III-N material layer such that a diode structure is formed in the substrate layer. For example, the reverse side (i.e., the side opposite the III-N material layers) of an n-type substrate, such as an n-type silicon substrate, can be implanted with p-type dopants, rendering the reverse side of the substrate p-type. The p-type dopants can be implanted either before or after formation of the III-N material layers. In another embodiment, a diode structure is formed in the substrate by implanting the side of the substrate upon which the III-N material layers are grown (i.e., the growth side of the substrate). For example, the growth side of a p-type substrate, such as a p-type silicon substrate, can be implanted with n-type dopants, rendering the growth side of the substrate n-type.

In some embodiments, the diode structure in the substrate is formed during formation of the substrate material layer(s). For example, the substrate 80 in FIG. 8 can be formed by first forming a p-type region 82 and then forming an n-type region 81 on the p-type region 82. One or both of the regions 81 and 82 can be formed by epitaxial growth. Region 81, that is the portion of the substrate adjacent to the III-N material layers, can be electrically conductive, partially conductive, or otherwise non-insulating. In other embodiments, the diode in the substrate can include additional portions, for example a lightly doped or intrinsic region between n-type region 81 and p-type-region 82, thereby forming a p-i-n diode structure in the substrate.

Figure 10:
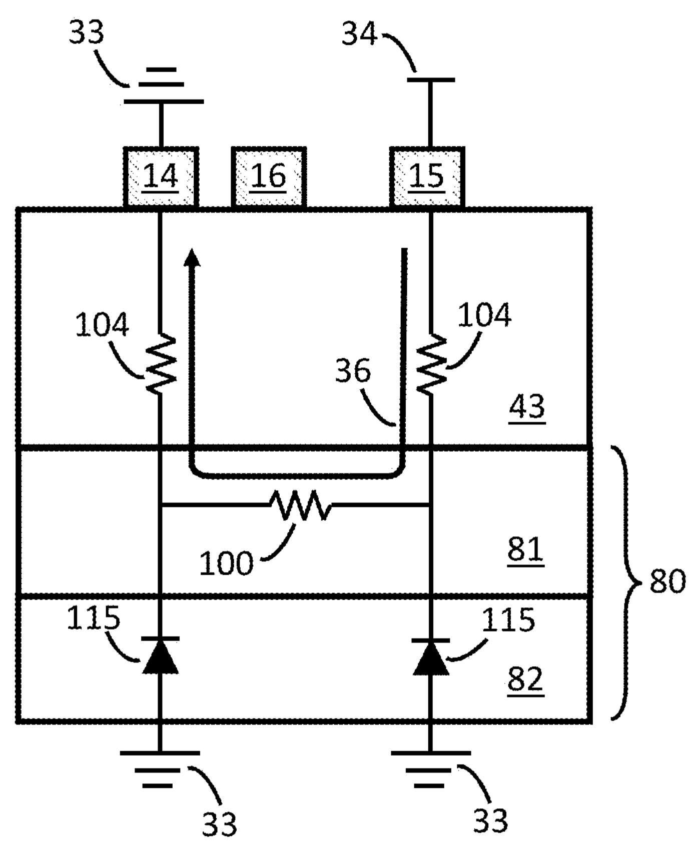
FIG. 10 is a representative circuit schematic showing equivalent discrete elements corresponding to various layers of the HEMT device of FIG. 8.

The diode in the substrate layer is formed such that the diode has a polarity to prevent current conduction in the substrate layer (e.g., reverse biased as seen from the device drain). FIG. 10 depicts a circuit schematic showing equivalent discrete elements corresponding to various layers of the HEMT device of FIG. 8. The circuit schematic is again drawn for the case where the device is mounted on a grounded portion and the device is biased in the off state, such that it blocks a high voltage 34. Under these conditions, the diodes 115 are reversed biased, preventing subsurface drain leakage currents from flowing through the entire thickness of the substrate to ground 33. Hence, the subsurface drain leakage current 36 flows from drain 15 to source 14 along the path shown, thereby resulting in a larger effective drain resistance and lower drain leakage currents than in a device lacking a barrier layer.

In general, the diode can be a power diode, a p-n diode, a p-i-n diode, or a p-i-n power diode, for example. For example, a GaN HEMT can be grown on an n-i-p power diode based on silicon or other material systems.

Figure 11:
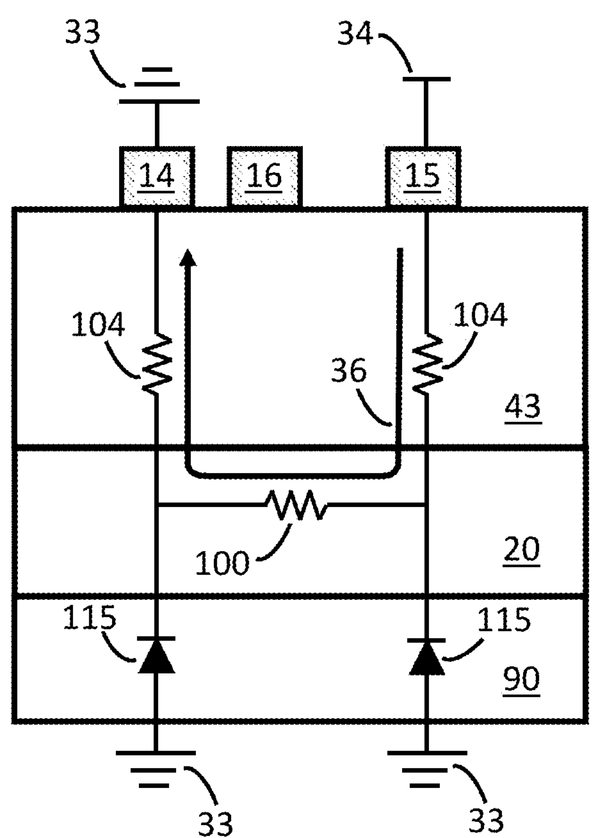
FIG. 11 is a representative circuit schematic showing equivalent discrete elements corresponding to various layers of the HEMT device of FIG. 9.

FIG. 9 is a cross-sectional view of a III-N transistor similar to that of FIG. 1, but further including a diode structure 90 on an opposite side of the conductive substrate 20 from the III-N material layers 43. Diode structure 90 can include an n-type region 91 and a p-type region 92, or can be formed as any of the diode structures described for the substrate layer 80 of FIG. 8. FIG. 11 depicts a circuit schematic showing equivalent discrete elements corresponding to various layers of the HEMT device of FIG. 9. The circuit schematic is again drawn for the case where the device is mounted on a grounded portion and the device is biased in the off state, such that it blocks a high voltage 34. Under these conditions, the diodes 115 are reversed biased, preventing subsurface drain leakage currents from flowing through the entire thickness of the substrate to ground 33. Hence, the subsurface drain leakage current 36 flows from drain 15 to source 14 along the path shown, thereby resulting in a larger effective drain resistance and lower drain leakage currents than in a device lacking a barrier layer.

Figure 12:
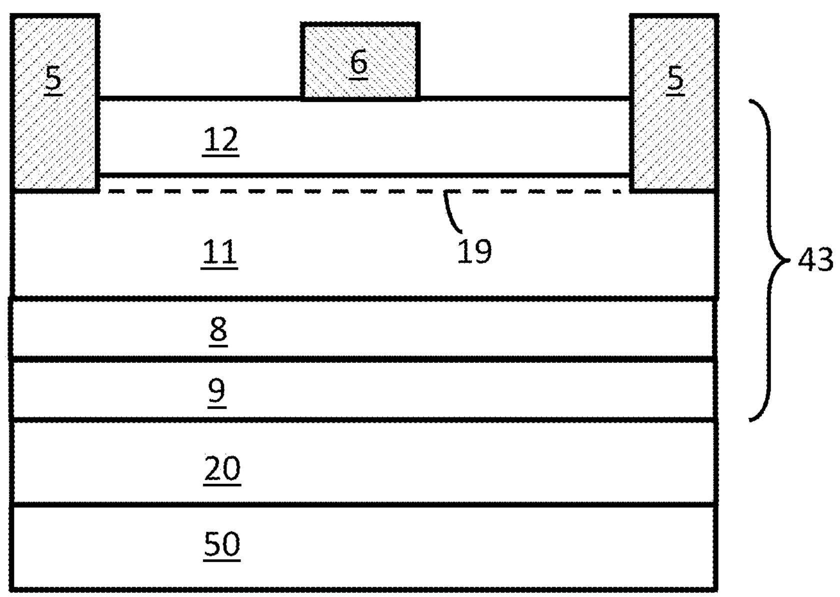
FIG. 12 illustrates an example III-N diode structure utilizing a barrier layer.

While the implementations described above and illustrated in FIGS. 1-11 pertained to III-N transistor devices such as III-N HEMTs, the use of a barrier layer can also be beneficial in other III-N devices, such as III-N diodes. An example III-N diode structure utilizing a barrier layer is illustrated in FIG. 12. The III-N diode in the example of FIG. 12 includes similar or the same material layers to those of the HEMT of FIG. 5. However, the electrode structure is different. The diode of FIG. 12 includes an anode contact 6 which directly contacts at least one of the underlying III-N material layers. The anode contact 6 can form a Schottky contact to the III-N material layer or layers which it directly contacts. The diode also includes a single cathode contact 5 which contacts the device channel (i.e., 2DEG 19) and can form an ohmic contact to the device channel. When the diode is forward biased and conducting current, the voltage of anode contact 6 is larger than that of cathode contact 5. When the diode is reverse biased and blocking a voltage, the voltage of cathode contact 5 is larger than that of anode contact 6, and only a small reverse leakage current flows through the diode.

As with the III-N HEMT of FIG. 5, barrier layer 50 prevents current from being able to flow from the anode contact 6 or the cathode contact 5 directly to ground through substrate layer 20 when the barrier layer 50 is mounted on a circuit ground, such as when the III-N diode is packaged and operated in a circuit. Hence, when a sufficiently insulating barrier layer 50 is used, the off-state drain leakage current of the diode in applications where the barrier layer 50 is mounted on a circuit ground can be approximately half that of a diode which lacks the barrier layer 50 but is otherwise identical to that of FIG. 12.

Figure 13:
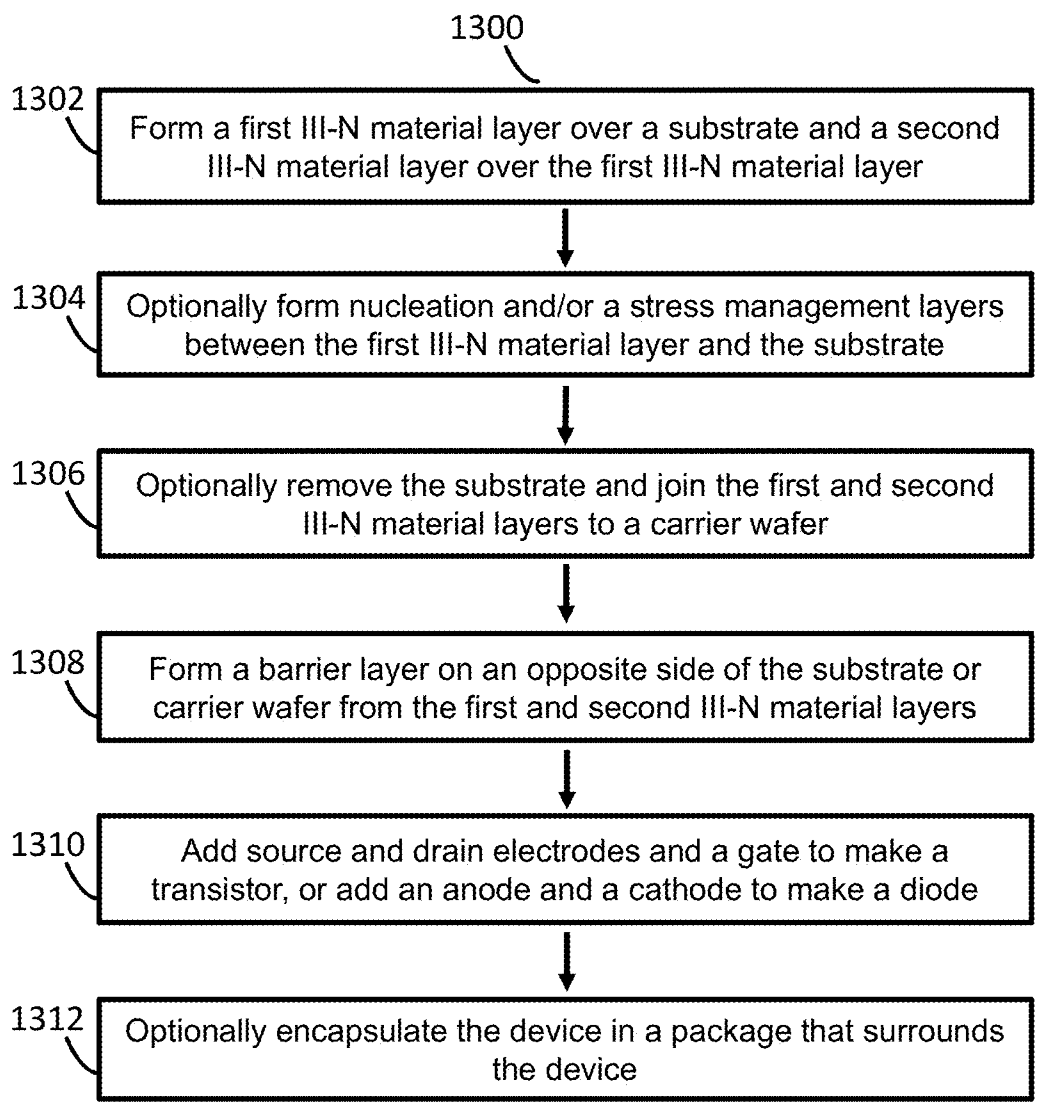
FIG. 13 is a flow diagram of an example process 1300 for producing a III-N device.

FIG. 13 is a flow diagram of an example process 1300 for producing a III-N device, e.g., any of the devices described above.

First and second III-N material layers are formed (e.g., layers 11 and 12 in FIG. 5), the second III-N material layer being above the first III-N material layer (step 1302). For example, the first and second III-N material layers can be formed by epitaxial growth or deposition.

The first and second III-N material layers can be formed on any of various appropriate structures. For example, the first and second III-N material layers can be deposited on a substrate, on a non-insulating layer (e.g., layer 20 in FIG. 5), or on a diode structure (e.g., as layers 81 and 82 in FIG. 8 or layers 91 and 92 in FIG. 9). In some implementations, a nucleation layer and/or a stress management layer (e.g., layers 8 and 9 in FIG. 5) are formed on a structure (step 1304), and the first and second III-N material layers are formed on the nucleation layer or stress management layer.

In some implementations where the first and second III-N material layers are deposited on a substrate, the substrate is subsequently removed after the deposition, and the first and second III-N material layers are joined to a carrier wafer (step 1306). The surface of the first and second III-N material layers that is exposed by removal of the substrate can be attached or bonded to the carrier wafer.

When the first and second III-N material layers are formed on a non-insulating layer, such as a non-insulating substrate, a barrier layer (e.g., layer 50 in FIG. 5) may be formed on the opposite side of the non-insulating layer from the III-N material layers (step 1308). In cases where the substrate is removed and the first and second III-N material layers are joined to a carrier wafer, the barrier layer can be formed on the opposite side of the carrier wafer from the III-N material layers.

Contacts are added to the device to make it a transistor (e.g., as shown in FIGS. 5, 8, and 9) or a diode (e.g., as shown in FIG. 12) (step 1310). If the device is a transistor, source and drain electrodes and a gate are added. If the device is a diode, an anode and a cathode are added.

In some implementations, the device is encapsulated in a package (e.g., the package 19 of FIG. 6) that surrounds the device (step 1312). For example, the device can be bonded to an electrically conductive package base. The package base can be grounded or electrically connected to ground. For example, the package can be mounted on a ground plane with the package based contacting the ground plane.

A number of implementations have been described. Nevertheless, it will be understood that various modifications may be made without departing from the spirit and scope of the techniques and devices described herein. Features shown in each of the implementations may be used independently or in combination with one another. Accordingly, other implementations are within the scope of the following claims.

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." As used herein, the terms "connected," "coupled," or any variant thereof, means any connection or coupling, either direct or indirect, between two or more elements; the coupling of connection between the elements can be physical, logical, or a combination thereof.

Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively. The word "or," in reference to a list of two or more items, covers all of the following interpretations of the word: any of the items in the list, all of the items in the list, and any combination of the items in the list.

The above detailed description of embodiments of the disclosure is not intended to be exhaustive or to limit the teachings to the precise form disclosed above. While specific embodiments of, and examples for, the disclosure are described above for illustrative purposes, various equivalent modifications are possible within the scope of the disclosure, as those skilled in the relevant art will recognize. For example, while processes or blocks are presented in a given order, alternative embodiments may perform routines having steps, or employ systems having blocks, in a different order, and some processes or blocks may be deleted, moved, added, subdivided, combined, and/or modified to provide alternative or subcombinations. Each of these processes or blocks may be implemented in a variety of different ways. Also, while processes or blocks are at times shown as being performed in series, these processes or blocks may instead be performed in parallel, or may be performed at different times. Further, any specific numbers noted herein are only examples: alternative implementations may employ differing values or ranges.

The teachings of the disclosure provided herein can be applied to other systems, not necessarily the system described above. The elements and acts of the various embodiments described above can be combined to provide further embodiments.

Any patents and applications and other references noted above, including any that may be listed in accompanying filing papers, are incorporated herein by reference. Aspects of the disclosure can be modified, if necessary, to employ the systems, functions, and concepts of the various references described above to provide yet further embodiments of the disclosure.

These and other changes can be made to the disclosure in light of the above Detailed Description. While the above description describes certain embodiments of the disclosure, and describes the best mode contemplated, no matter how detailed the above appears in text, the teachings can be practiced in many ways. Details of the system may vary considerably in its implementation details, while still being encompassed by the subject matter disclosed herein. As noted above, particular terminology used when describing certain features or aspects of the disclosure should not be taken to imply that the terminology is being redefined herein to be restricted to any specific characteristics, features, or aspects of the disclosure with which that terminology is associated. In general, the terms used in the following claims should not be construed to limit the disclosure to the specific embodiments disclosed in the specification, unless the above Detailed Description section explicitly defines such terms. Accordingly, the actual scope of the disclosure encompasses not only the disclosed embodiments, but also all equivalent ways of practicing or implementing the disclosure under the claims.

What is claimed is:

1. A III-N device, comprising:
- a silicon substrate having a first side and a second side opposite the first side;
- a nucleation layer on the first side of the silicon substrate;
- a stress management layer on the nucleation layer;
- a first III-N material layer on the stress management layer, the first III-N material layer including a channel layer having a conductive channel therein;
- a second III-N material layer on the first III-N material layer;
- an electrode contacting the channel;
- a barrier layer disposed on the second side of the silicon substrate, the barrier layer being less electrically conductive than the silicon substrate; and
- an electrically conductive layer on a side of the barrier layer opposite the silicon substrate; wherein
- the electrode is directly connected to the electrically conductive layer.

2. The device of claim 1, wherein, the electrically conductive layer is a portion of a device package.

3. The device of claim 1, wherein the electrically conductive layer is configured to be grounded or connected to a ground.

4. The device of claim 1, wherein the barrier layer is configured to reduce, relative to a device lacking the barrier layer, a leakage current from the channel layer to the electrically conductive layer during device operation.

5. The device of claim 1, wherein the silicon substrate is a conductive or partially conductive substrate.

6. The device of claim 1, wherein the barrier layer includes high electrical resistivity material.

7. The device of claim 1, wherein the barrier layer includes electrically insulating material.

8. The device of claim 1, wherein the barrier layer includes thermally conductive material.

9. The device of claim 1, wherein the barrier layer includes AIN or a ceramic material.

10. The device of claim 9, wherein the conductive channel is a 2DEG channel, and wherein a compositional difference between the first III-N material layer and the second III-N material layer induces the 2DEG channel in the first III-N material layer.

11. The device of claim 10, wherein the electrode is a source contact, the device further comprising a drain contact and a gate, the source and drain contacts and gate being over a side of the second III-N material layer opposite the first III-N material layer.

12. A III-N device, comprising:
- a silicon substrate having a first side and a second side opposite the first side;
- a first III-N material layer on the first side of the silicon substrate, the first III-N material layer including a channel layer having a conductive channel therein;
- a second III-N material layer on the first III-N material layer;
- an electrode contacting the channel;
- a barrier layer disposed on the second side of the silicon substrate, the barrier layer being less electrically conductive than the silicon substrate; and
- an electrically conductive layer on a side of the barrier layer opposite the silicon substrate;
- wherein the barrier layer is bonded to the silicon substrate, and the electrode is directly connected to the electrically conductive layer.

13. The device of claim 12, wherein, the electrically conductive layer is a portion of a device package.

14. The device of claim 12, wherein the electrically conductive layer is configured to be grounded or connected to a ground.

15. The device of claim 12, wherein the barrier layer is configured to reduce, relative to a device lacking the barrier layer, a leakage current from the channel layer to the electrically conductive layer during device operation.

16. The device of claim 12, wherein the silicon substrate is a conductive or partially conductive substrate.

17. The device of claim 12, wherein the barrier layer includes high electrical resistivity material.

18. The device of claim 12, wherein the barrier layer includes electrically insulating material.

19. The device of claim 12, wherein the barrier layer includes thermally conductive material.

20. The device of claim 12, wherein the barrier layer includes AlN or a ceramic material.

21. The device of claim 12, wherein the conductive channel is a 2DEG channel, and wherein a compositional difference between the first III-N material layer and the second III-N material layer induces the 2DEG channel in the first III-N material layer.

22. The device of claim 21, wherein the electrode is a source contact, the device further comprising a drain contact and a gate, the source and drain contacts and gate being over a side of the second III-N material layer opposite the first III-N material layer.

23. A III-N device, comprising:
- a silicon substrate having a first side and a second side opposite the first side;
- a first III-N material layer on the first side of the silicon substrate, the first III-N material layer including a channel layer;
- a second III-N material layer on the first III-N material layer;
- a barrier layer disposed on the second side of the silicon substrate, the barrier layer being less electrically conductive than the silicon substrate;
- an electrically conductive layer on a side of the barrier layer opposite the silicon substrate; and
- a source contact, a drain contact and a gate; wherein
- a compositional difference between the first III-N material layer and the second III-N material layer induces a 2DEG channel in the first III-N material layer, the gate is adjacent to the second III-N material layer, the source contact and drain contact are in electrical contact with the 2DEG, and the device is an enhancement mode FET; and
- the source contact is directly connected to the electrically conductive layer.

24. The device of claim 23, wherein, the electrically conductive layer is a portion of a device package.

25. The device of claim 23, wherein the electrically conductive layer is configured to be grounded or connected to a ground.

26. The device of claim 23, wherein the barrier layer is configured to reduce, relative to a device lacking the barrier layer, a leakage current from the channel layer to the electrically conductive layer during device operation.

27. The device of claim 23, wherein the silicon substrate is a conductive or partially conductive substrate.

28. The device of claim 23, wherein the barrier layer includes AIN or a ceramic material.

29. A III-N device, comprising:
- a silicon substrate having a first side and a second side opposite the first side;

a first III-N material layer on the first side of the silicon substrate, the first III-N material layer including a channel layer;

a second III-N material layer on the first III-N material layer; and a barrier layer disposed on the second side of the silicon substrate, the barrier layer being less electrically conductive than the silicon substrate;

an electrically conductive layer on a side of the barrier layer opposite the silicon substrate; and a source contact, a drain contact and a gate; wherein a compositional difference between the first III-N material layer and the second III-N material layer induces a 2DEG channel in the first III-N material layer, the gate is in contact with the second III-N material layer, the source contact and drain contact are in electrical contact with the 2DEG, and the device is a depletion mode FET; and the source contact is directly connected to the electrically conductive layer.

30. A III-N device, comprising:

a silicon substrate having a first side and a second side opposite the first side;

a first III-N material layer on the first side of the silicon substrate, the first III-N material layer including a channel layer;

a second III-N material layer on the first III-N material layer;

a barrier layer disposed on the second side of the silicon substrate, the barrier layer being less electrically conductive than the silicon substrate;

an electrically conductive layer on a side of the barrier layer opposite the silicon substrate;

an anode contacting at least one of the first and second III-N material layers; and a cathode; wherein a compositional difference between the first III-N material layer and the second III-N material layer induces a 2DEG channel in the first III-N material layer, the cathode contacts the 2DEG channel, and the device is a diode; and the anode is directly connected to the electrically conductive layer.

* * * * *